United States Patent [19]

Tanaka et al.

[11] Patent Number: 4,459,349

[45] Date of Patent: Jul. 10, 1984

[54] PHOTOSENSITIVE RESIN COMPOSITION

[75] Inventors: Toshikiyo Tanaka, Toyonaka; Yoshio Katoh, Otsu; Satoshi Imahashi, Otsu; Toshihiko Kajima, Otsu; Hisashi Uhara, Otsu, all of Japan

[73] Assignee: Toyo Boseki Kabushiki Kaisha, Osaka, Japan

[21] Appl. No.: 360,961

[22] Filed: Mar. 23, 1982

[30] Foreign Application Priority Data

Mar. 27, 1981 [JP] Japan .................................. 56-46068
Sep. 9, 1981 [JP] Japan .................................. 56-143022

[51] Int. Cl.³ ........................ G03C 1/68; G03C 1/727
[52] U.S. Cl. .................................... 430/281; 430/916; 430/919; 430/920; 204/159.15; 204/159.18; 204/159.23
[58] Field of Search ............... 430/281, 920, 916, 919; 204/159.15, 159.18, 159.23

[56] References Cited

U.S. PATENT DOCUMENTS 3,445,234  5/1969  Cescon et al. ...................... 430/332
3,844,790  10/1974  Chang et al. ...................... 430/920

FOREIGN PATENT DOCUMENTS 997396  7/1965  United Kingdom .

Primary Examiner—Mary F. Downey

[57] ABSTRACT

A photosensitive resin composition which comprises (1) an ethylenically unsaturated compound which can be addition polymerized to form a high molecular compound, said addition polymerizaton being initiated by a free radical and of chain-propagation, (2) a 2-polycyclic aryl-4,5-diphenylimidazolyl dimer wherein the polycyclic aryl group comprises at least two benzene rings condensed each other and (3) at least one compound selected from the group consisting of dimedone, indolacetic acid, N-naphthylglycine, S-lower alkylthioglycollic acid, 4,4'-bis[di(lower)alkylamino]benzyl, p-di(lower)alkylaminobenzoic ester, leucocrystalviolet, indoxylic acid, rhodanine, 7-di(lower)alkylaminocumarine and diarylthiourea and their derivatives, the molar ratio of the component (2) and the component (3) being from 2:1 to 1:5.

8 Claims, No Drawings

PHOTOSENSITIVE RESIN COMPOSITION

This invention relates to a photosensitive resin composition. More particularly, it relates to a photosensitive resin composition comprising a photopolymerization initiation system highly sensitive to ultraviolet rays and thermally stable.

As well known, a photosensitive resin composition comprises usually a photopolymerizable ethylenically unsaturated compound, a binding agent and a photopolymerization initiator. Such composition is used for production of a relief printing plate, reproduction of an image, etc. For the purpose of this use, the composition is formed to make a layer and exposed through a positive or negative film or a pattern mask. As the result, the photopolymerization initiator in the composition is activated by light, and the addition polymerization of the ethylenically unsaturated compound is thus initiated. After sufficient exposure, the produced latent image is changed to a visible image by an appropriate procedure such as washing out with a solvent, selective elimination, thermal transfer or application of a pigment.

As the photopolymerization initiator for a photosensitive resin composition comprising a photopolymerizable ethylenically unsaturated compound, there is usually employed benzoin alkyl ethers, benzophenones, etc. However, the polymerization initiation potency of such photopolymerization initiator is much lowered by the influence of oxygen dissolved in the composition as well as oxygen in the air diffusing into the composition. Because of this reason, the appearance of a highly sensitive photopolymerization initiator being hardly influenced by oxygen or having a radical producing rate much higher than a radical quenching rate with oxygen has been demanded. This demand is particularly strong in the case that the layer of a photosensitive resin composition is relatively small in thickness so that the influence of air contacting on the surface is apt to be received, or in the case that the layer of a photosensitive resin composition comprises a relatively large amount of a ultraviolet rays absorbing material such as a pigment so that a sufficient amount of ultraviolet rays can not reach to the lower part of the layer.

The combination of 2,4,5-triphenylimidazolyl dimer with leuco dye as disclosed in Japanese Patent Publn. No. 37377/70, the combination of 2,4,5-triphenylimidazolyl dimer with Michler's ketone as disclosed in Japanese Patent Publn. No. 38403/73, etc. meet said demand to a certain extent. However, even these photopolymerization initiation systems are not satisfactorily effective in curing the layer of a photosensitive resin composition having a small thickness and yet containing a high concentration of a ultraviolet ray absorbing material such as a pigment. Recently, the combination of a 2-polycyclic aryl-4,5-diphenylimidazolyl dimer with a heterocyclic organic mercaptan compound has been proposed in Japanese Patent Publn. (unexamined) No. 34707/1979, and this combination provides somewhat satisfactory results.

Apart from the above, a photosensitive resin composition is desired to have good thermal stability. When the thermal stability of the composition is poor, polymerization proceeds by dark reaction so that the performances such as sensitivity are deteriorated with the lapse of time even at room temperature. When irradiated with activating light, a photopolymerization initiator produces radicals which initiate addition polymerization by chain-propagation. The same reaction as above may be also started by heat. It is, therefore, very difficult to find out a photopolymerization initiator which shows high sensitivity as well as good thermal stability.

As a result of the extensive study seeking a photopolymerization initiation system having high sensitivity and good thermal stability, it has been found that the combination of a 2-polycyclic aryl-4,5-diphenylimidazolyl dimer with a certain specific radical producing agent meets such requirements.

Based on the above finding, the present invention provides a photosensitive resin composition which comprises (1) an ethylenically unsaturated compound which can be addition polymerized to form a high molecular compound, said addition polymerization being initiated by a free radical and of chain-propagation, (2) a 2-polycyclic aryl-4,5-diphenylimidazolyl dimer wherein the polycyclic aryl group comprises at least two benzene rings condensed each other and (3) at least one compound selected from the group consisting of dimedone, indolacetic acid, N-naphthylglycine, S-lower alkylthioglycollic acid, 4,4'-bis(di(lower)alkylamino)benzyl, p-di(lower)alkylaminobenzoic ester, leucocrystalviolet, indoxylic acid, rhodanine, 7-di(lower)alkylaminocumarine and diarylthiourea and their derivatives, the molar ratio of the component (2) and the component (3) being from 2:1 to 1:5.

The 2-polycyclic aryl-4,5-diphenylimidazolyl dimer is representable by the formula:

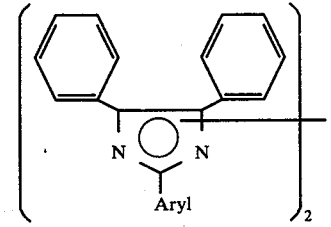

wherein Aryl represents a condensed ring comprising at least two benzene rings, Aryl and two phenyl groups therein bearing optionally any substituent(s). In order to improve the heat stability, Aryl is preferred to be the one substituted with a halogen atom such as fluorine, chlorine or bromine at least at the ortho-position(s). The phenyl groups are not necessarily required to be substituted, but it is preferred that they are substituted with $C_1$–$C_3$ alkoxy and/or halogen (e.g. fluorine, chlorine, bromine) at the meta-position(s).

Specific examples of the 2-polycyclic aryl-4,5-diphenylimidazolyl dimer are 2-(1-naphthyl)-4,5-diphenylimidazolyl dimer, 2-(2-naphthyl)-4,5-diphenylimidazolyl dimer, 2-(9-anthryl)-4,5-diphenylimidazolyl dimer, 2-pyrenyl-4,5-diphenylimidazolyl dimer, 2-(9-phenanthryl)-4,5-diphenylimidazolyl dimer, 2-(2-chloro-1-naphthyl)-4,5-diphenylimidazolyl dimer, 2-(2-bromo-1-naphthyl)-4,5-diphenylimidazolyl dimer, 2-(2-fluoro-1-naphthyl)-4,5-diphenylimidazolyl dimer, 2-(1-chloro-2-naphthyl)-4,5-diphenylimidazolyl dimer, 2-(2,4-dichloro-1-naphthyl)-4,5-diphenylimidazolyl dimer, 2-(1-naphthyl)-4,5-di(m-methoxyphenyl)imidazolyl dimer, 2-(1-chloro-2-naphthyl)-4,5-di(m-methoxyphenyl)imidazolyl dimer, 2-(1-naphthyl)-4,5-di(m-chlorophenyl)imidazolyl dimer, 2-

(10-chloro-9-phenanthryl)-4,5-diphenylimidazolyl dimer, etc.

The polymerization initiation potency and the thermal stability widely vary with the kind of the substituent at the 2-position of the imidazolyl ring, i.e. the aryl group comprising at least two benzene rings condensed each other, and the kind of the radical producing agent, and those having a polycyclic aryl group show much higher photopolymerization initiation potency and thermal stability than those having a monocyclic aryl group, in the combined use with the certain specific radical producing agent as used in this invention.

The 2-polycyclic aryl-4,5-diphenylimidazolyl dimer can be prepared by the method as described in Hayashi et al.: Bull. Chem. Soc. Japan, 33, 565 (1960). Namely, a polycyclic aryl aldehyde and benzil or its derivative are refluxed in the presence of an excessive amount of ammonium acetate to produce 2-polycyclic aryl-4,5-diphenylimidazole. This compound is dissolved in an ethanolic solution of potassium hydroxide, followed by introducing oxygen therein under cooling with ice while adding an aqueous solution of potassium ferricyanide dropwise thereto. As the starting polycyclic aryl aldehyde, there may be used 1-naphthylaldehyde, 2-naphthylaldehyde, 9-anthrylaldehyde, pyrenylaldehyde, etc. These may optionally bear a substituent(s) such as lower alkyl, lower alkoxy and halogen on the phenyl group and/or the polycyclic aryl group.

As a radical producing agent, there may be used amines, particularly tertiary amines, leuco dyes, halogenated hydrocarbons, N-phenylglycine, dimedone, thioureas, etc. Among various radical producing agents, dimedone, indolacetic acid, N-naphthylglycine, S-lower alkylthioglycollic acid, 4,4'-bis(di(lower)alkylamino)benzyl, p-di(lower)alkylaminobenzoic ester, leucocrystalviolet, indoxylic acid, rhodanine, 7-di(-lower)alkylaminocumarine and diarylthiourea and their derivatives have been found to be excellent in the combined use with the 2-polycyclic aryl-4,5-diphenylimidazolyl dimer. Specific examples of the radical producing agent are dimedone, rhodanine, N-naphthylglycine, N-naphthylglycine ethyl ester, 7-dimethylamino-4-methylcumarine, 7-diethylamino-4-methylcumarine, 7-dipropylamino-4-methylcumarine, diphenylthiourea, di-m-chlorophenylthiourea, methyl p-diethylaminobenzoate, ethyl p-dimethylaminobenzoate, tri(p-diethylamino-o-tolyl)methane, tri(p-dimethylamino-o-tolyl)methane, p-dimethylaminobenzilidene-rhodanine, 1-chloroindoxylic acid, 2-chloroindoxylic acid, 4,4'-bis(diethylamino)benzyl, 5-chloroindolacetic acid, leucocrystalviolet, etc.

The molar ratio of the 2-polycyclic aryl-4,5-diphenylimidazolyl dimer and the radical producing agent may be usually from 2:1 to 1:5. When the molar ratio is more than 2:1, the sensitivity of the resin composition reduces. Since the use of the radical producing agent in large excess is uneconomical, the lower limit of the molar ratio is preferably 1:5.

The photosensitive resin composition of the invention comprises, in addition to the polymerization initiation system, an ethylenically unsaturated compound and optionally a binding agent.

As the ethylenically unsaturated compound, of which the polymerization is initiated by a free radical to afford a high molecular compound by addition polymerization, there are exemplified alkyl or cycloalkyl acrylates (e.g. cyclohexyl acrylate, decyl acrylate, lauryl acrylate), hydroxyalkyl acrylates (e.g. 2-hydroxyethyl acrylate), aminoalkyl acrylates (e.g. N,N-dimethylaminoethyl acrylate), alkoxyalkyl acrylates (e.g. 2-methoxyethyl acrylate), epoxyalkyl acrylates (e.g. glycidyl acrylate), haloalkyl acrylates (e.g. 2-chloroethyl acrylate), polyfunctional acrylates (e.g. trimethylolpropane triacrylate, trimethylolpropane trimethacrylate, triethyleneglycol dimethacrylate), etc. There may be also used thermoplastic polymers having an ethylenically unsaturated group at the side chain such as the one of the formula:

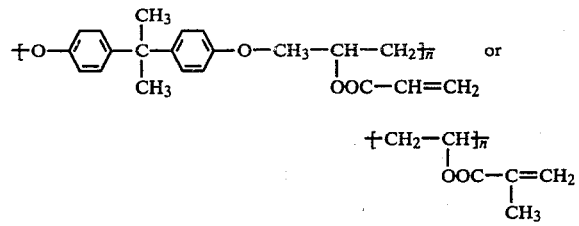

The binding agent as the optical component serves to regulate the physical properties of the photosensitive resin composition, and various soluble polymers may be employed as the binding agent. Specific examples of the binding agent are those which become insoluble in a solvent as the whole together with the ethylenically unsaturated compound (irrespective of being bound or not with the ethylenically unsaturated compound) on the irradiation such as polyamides, polyacrylic esters, acrylic acid/alkyl acrylate copolymers, methacrylic acid/alkyl methacrylate copolymers, polyvinylphenols, polyvinyl esters, polyacrylamides, polyvinyl alcohols, polyethylene oxides, gelatin, cellulose esters, cellulose ethers, etc.

Suitable binding agents are polymers which have a carboxyl group, a phenolic group or a sulfonic acid group, or a nitrogen atom quaternizable with an acid. The polymers having a carboxyl group, a phenolic group or a sulfonic acid group are developable with an aqueous alkaline solution and can be washed out or fixed with water. The polymers having a quaternizable nitrogen atom are developable with an aqueous acidic solution and can be washed out or fixed with water.

The photosensitive resin composition of the invention can be used for preparation of printing materials such as printing plates (e.g. a relief printing plate, a lithographic printing plate, etc.), a non-silver litho film and a color correcting mask as well as materials for electronics such as a liquid or film photoresist and a solder mask.

A typical example of the weight proportion of the components in the photosensitive resin composition of the invention directed to the said use is as follows: the combined amount of the 2-polycyclic aryl-4,5-diphenylimidazolyl dimer and the radical producing agent, 0.3 to 15% by weight (on the basis of the total weight of the composition); the ethylenically unsaturated compound, 30 to 80% by weight; the binding agent, 0 to 60% by weight, preferably 10 to 60% by weight.

In the photosensitive resin composition of the invention, there may be additionally incorporated other various additives depending on necessity. Examples of such additives are carbon black, titanium oxide, powders of metals and metal oxides, light absorbers such as pigments and dyes, various energy transferable dyes, oxygen scavengers, chain transfer promoters, thermal polymerization inhibitors, etc.

These additives are usually incorporated into the photosensitive resin composition of the invention in such a small amount of up to 3%. When pigments are incorporated, their amount is usually from 5 to 75% based on the total weight of the composition to make ultraviolet rays curing paints, inks, compositions for preparation of non-silver litho films, etc. For manufacture of image-forming plates, the photosensitive resin composition may be applied onto any substrate to make a coating layer or molded to shape a sheet.

On the use of a photopolymerizable image-forming plate, such plate is subjected to exposure through a suitable original pattern film or a pattern mask, followed by development to make a visible image. As already stated, the photopolymerization initiation system of the invention has a high sensitivity so that the curing of the image-forming plate can be attained by exposure within a short period of time. Further, the photopolymerization initiation system has good thermal stability, and therefore the performances of the image-forming plate are not hardly deteriorated after stored over a period of more than one year at room temperature.

Practical and presently preferred embodiments of the invention are illustratively shown in the following examples wherein % and part(s) are by weight, unless otherwise indicated.

REFERENCE EXAMPLE 1

Preparation of 2-(1-naphthyl)-4,5-diphenylimidazolyl dimer

A solution of benzyl (16.8 parts), -naphthaldehyde (12.5 parts) and ammonium acetate (48 parts) in glacial acetic acid (400 parts) was refluxed for 1.5 hours. The reaction mixture was added to cold water, and the precipitate was collected by filtration, washed with water and dried. The dried product (26 parts) was recrystallized from ethanol to give 2-(1-naphthyl)-4,5-diphenylimidazole. M.P., 290° C.

The above obtained 2-(1-naphthyl)-4,5-diphenylimidazole (4 parts) was dissolved in a solution of potassium hydroxide (48 parts) in ethanol (400 parts). While keeping this solution at a temperature of 0° to 5° C., oxygen gas was introduced therein at a rate of 400 parts by volume/min, during which a 1% aqueous potassium ferricyanide solution (1800 parts) was dropwise added thereto in 3 hours under stirring. The reaction mixture was filtered, and the collected substance was washed with water, dried and recrystallized from benzene to give 2-(1-naphthyl)-4,5-diphenylimidazolyl dimer. From the consumed amount of hydroquinone under irradiation of ultraviolet rays, the purity was determined to be 79%.

REFERENCE EXAMPLE 2

Comparison of 2-polycyclic aryl-4,5-diphenylimidazolyl dimer with 2,4,5-triphenylimidazolyl dimer in photopolymerization initiation potency Using the following two compositions comprising an ethylenically unsaturated compound and a photopolymerization initiator, their behavior on the mixing of said monomer and said photopolymerization initiator was observed:

Composition A

|  |  |
| --- | --- |
| Trimethylolpropane triacrylate | 27.0 g |
| 2-(1-Naphthyl)-4,5-diphenyl-imidazolyl dimer | 8.05 g |
| N—(1-Naphthyl)glycine | 2.70 g |

Composition B

|  |  |
| --- | --- |
| Trimethylolpropane triacrylate | 27.0 g |
| 2-(o-Chlorophenyl)-4,5-diphenyl-imidazolyl dimer | 7.98 g |
| N—(1-Naphthyl)glycine | 2.63 g |

In the composition A, the mixing produced immediate and rapid generation of heat with white smoke, and the polymerization proceeded to solidify. In the composition B, the mixing did not produce any change, and it remained in a liquid state.

EXAMPLE 1

For judgement of the potency of the photopolymerization initiation system, 2-(2-chloro-1-naphthyl)-4,5-diphenylimidazolyl dimer and one of dimedone, indolacetic acid, N-naphthylglycine, S-n-butylthioglycollic acid, 4,4'-bis(dimethylamino)benzyl, p-dialkylaminobenzoic ester, leucocrystalviolet and indoxylic acid, their combined amount being 10 parts, were added to a mixture of the following materials:

|  |  |
| --- | --- |
| Methyl methacrylate/methacrylic acid (70/30 by mol) copolymer | 54.2 parts |
| Ethylene glycol diacetate | 3.8 parts |
| Trimethylolpropane triacrylate | 32.0 parts |
| Methanol | 217.0 parts |
| Methylene chloride | 136.0 parts |

After sufficient mixing, the resultant mixture was applied onto a transparent film of polyethylene terephthalate of 125 microns in thickness having a lined layer to make a coating layer of 5 microns in thickness after hot-air drying. Then, a 10% aqueous solution of polyvinyl alcohol (completely saponified; degree of polymerization, 500) was applied thereto to make an overcoat layer of 2 microns in thickness, whereby a clear test piece was obtained.

Onto the clear test piece as above obtained, a 21 2 step tablet (a gray film scale manufactured by Dainippon Screen Mfg. Co., Ltd.) as a negative film was placed and a ultra high pressure mercury lamp (a polymer printer 3000 manufactured by Oak Seisakusho, 140 W/m²) was irradiated thereto for 1 minute. The test piece was washed with water, immersed in a 4% aqueous solution of sodium carbonate at 25° C. for 10 seconds, again washed with water and dried. The step number at which the exposure and development of the 21 2 gray scale were completely achieved was examined to ascertain the sensitivity of the photopolymerization initiation system. The results are shown in Table 1 wherein the numeral indicates the sensitivity of the photopolymerization initiation system by the step number of the gray scale and the greater number represents a higher sensitivity.

TABLE 1

| Sample No. | Photopolymerization initiation system | Molar ratio | Sensitivity (step) |
| --- | --- | --- | --- |
| Present invention |  |  |  |
| 1 | 2-(2-Chloro-1-naphthyl)-4,5-diphenylimidazolyl dimer/Di- | 1/1 | 16 |

TABLE 1-continued

| Sample No. | Photopolymerization initiation system | Molar ratio | Sensitivity (step) |
|---|---|---|---|
| | medone | | |
| 2 | 2-(2-Chloro-1-naphthyl)-4,5-diphenylimidazolyl dimer/4,4'-Bis(dimethylamino)benzyl | 1/1 | 15 |
| 3 | 2-(2-Chloro-1-naphthyl)-4,5-diphenylimidazolyl dimer/N—(1-Naphthyl)glycine | 1/1 | 15 |
| 4 | 2-(2-Chloro-1-naphthyl)-4,5-diphenylimidazolyl dimer/S-n-Butylthioglycollic acid | 1/1 | 15 |
| 5 | 2-(2-Chloro-1-naphthyl)-4,5-diphenylimidazolyl dimer/Indolacetic acid | 1/1 | 15 |
| 6 | 2-(2-Chloro-1-naphthyl)-4,5-diphenylimidazolyl dimer/Ethyl p-diethylaminobenzoate | 1/1 | 10 |
| 7 | 2-(2-Chloro-1-naphthyl)-4,5-diphenylimidazolyl dimer/Leucocrystalviolet | 1/1 | 10 |
| 8 | 2-(2-Chloro-1-naphthyl)-4,5-diphenylimidazolyl dimer/Indoxylic acid | 1/1 | 15 |
| Comparative | | | |
| 9 | 2-(o-Chlorophenyl)-4,5-diphenylimidazolyl dimer/Dimedone | 1/1 | 11 |
| 10 | 2-(o-Chlorophenyl)-4,5-diphenylimidazolyl dimer/4,4'-Bis(dimethylamino)benzyl | 1/1 | 10 |
| 11 | 2-(o-Chlorophenyl)-4,5-diphenylimidazolyl dimer/N—(1-naphthyl)glycine | 1/1 | 10 |
| 12 | 2-(o-Chlorophenyl)-4,5-diphenylimidazolyl dimer/S-n-Butylthioglycollic acid | 1/1 | 10 |
| 13 | 2-(o-Chlorophenyl)-4,5-diphenylimidazolyl dimer/Indolacetic acid | 1/1 | 10 |
| 14 | 2-(o-Chlorophenyl)-4,5-diphenylimidazolyl dimer/Ethyl p-diethylaminobenzoate | 1/1 | 5 |
| 15 | 2-(o-Chlorophenyl)-4,5-diphenylimidazolyl dimer/Leucocrystalviolet | 1/1 | 5 |
| 16 | 2-(o-Chlorophenyl)-4,5-diphenylimidazolyl dimer/Indoxylic acid | 1/1 | 10 |
| 17 | 2-(2-Chloro-1-naphthyl)-4,5-diphenylimidazolyl dimer/2-Mercaptobenzoxazole | 1/1 | 15–16 |
| 18 | 2-(2-Chloro-1-naphthyl)-4,5-diphenylimidazolyl dimer/2-Mercaptobenzimidazole | 1/1 | 16 |
| 19 | 2-(2-Chloro-1-naphthyl)-4,5-diphenylimidazolyl dimer | — | 0 |

In the above Table, Sample Nos. 1 to 8 are the embodiments of this invention. Sample Nos. 9 to 16 wherein known 2,4,5-triphenylimidazolyl dimer was used are for the comparison. From the above results, it is understood that the photopolymerization initiation system of this invention attains the increase of the sensitivity by a gray scale of 3 to 5 in average. Sample Nos. 17 and 18 are also for the comparison and show the sensitivity of combination of the 2-polycyclic aryl-4,5-diphenylimidazolyl dimer with a heterocyclic organic mercaptan as disclosed in Japanese Patent Publn. (unexamined) No. 34707/1979. The photopolymerization initiation system of the invention has sensitivity as good as that of the photopolymerization initiation system disclosed in said publication. From the result of Sample 19 wherein no radical producing agent was used, it is clear that the 2-polycyclic aryl-4,5-diphenylimidazolyl dimer alone does not show any photopolymerization initiation potency.

Under the same experimental conditions as above, the use of benzoin ethyl ether which is a conventional photopolymerization initiator does not reach any step within the gray scale in case of exposure for 1 minute and reaches a step of 5 in case of exposure for 5 minutes. When the combination of benzophenone with Michler's ketone (7/1 by mol) which is a conventional photopolymerization initiation system for pigment-containing ultraviolet ray-curing paints and inks is used, a scale of 9 is reached by exposure for 5 minutes.

EXAMPLE 2

In the same manner as in Example 1 but using a photopolymerization initiation system as shown in Table 2, there was prepared a clear test piece, which was subjected to judgement of the sensitivity. The results are shown in Table 2.

TABLE 2

| Sample No. | Photopolymerization initiation system | Molar ratio | Sensitivity (step) |
|---|---|---|---|
| 20 | 2-(1-Naphthyl)-4,5-diphenylimidazolyl dimer/Dimedone | 1/1 | 16 |
| 21 | 2-(2-Fluoro-1-naphthyl)-4,5-diphenylimidazolyl dimer/Dimedone | 1/1 | 16 |
| 22 | 2-(2-Bromo-1-naphthyl)-4,5-diphenylimidazolyl dimer/Dimedone | 1/1 | 16 |
| 23 | 2-(2,4-Dibromo-1-naphthyl)-4,5-diphenylimidazolyl dimer/Dimedone | 1/1 | 15–16 |
| 24 | 2-(2,4-Dichloro-1-naphthyl)-4,5-Diphenylimidazolyl dimer/Dimedone | 1/1 | 14 |
| 25 | 2-(1-Naphthyl)-4,5-di(m-chlorophenyl)imidazolyl dimer/Dimedone | 1/1 | 16 |
| 26 | 2-(1-Naphthyl)-4,5-di(m-methoxyphenyl)imidazolyl dimer/Dimedone | 1/1 | 15 |
| 27 | 2-(2-Naphthyl)-4,5-diphenylimidazolyl dimer/Dimedone | 1/1 | 14 |
| 28 | 2-(9-Phenanthryl)-4,5-diphenylimidazolyl dimer/Dimedone | 1/1 | 14 |
| 29 | 2-(9-Anthryl)-4,5-diphenylimidazolyl dimer/Dimedone | 1/1 | 14 |

As understood from the above Table, Sample Nos. 21 to 24 (the naphthyl group being substituted), Sample Nos. 25 and 26 (the phenyl group being substituted) and sample Nos. 28 and 29 (the polycyclic aryl group being a condensed cyclic one other than naphthyl) show all high sensitivity.

EXAMPLE 3

For judgement of the thermal stability of the photopolymerization initiation system, the clear test pieces obtained in Examples 1 and 2 were stored in an incubator maintained at 40° C. for one, two or three months and subjected to judgement of the sensitivity. The results are shown in Table 3.

TABLE 3

| Sample No. | Sensitivity (step) | | | |
|---|---|---|---|---|
| | Not incubated | After one month | After two months | After three months |
| 1 | 16 | 16 | 16 | 16 |
| 2 | 15 | 15 | 15 | 15 |
| 3 | 15 | 15 | 15 | 15 |
| 4 | 15 | 15 | 15 | 15 |

TABLE 3-continued

| Sample No. | Sensitivity (step) | | | |
|---|---|---|---|---|
| | Not in-cubated | After one month | After two months | After three months |
| 5 | 15 | 15 | 15 | 15 |
| 6 | 10 | 10 | 10 | 10 |
| 7 | 10 | 10 | 10 | 10 |
| 8 | 15 | 15 | 15 | 15 |
| 9 | 11 | 11 | 11 | 11 |
| 10 | 10 | 10 | 10 | 10 |
| 11 | 10 | 10 | 10 | 10 |
| 12 | 10 | 10 | 10 | 10 |
| 13 | 10 | 10 | 10 | 10 |
| 14 | 5 | 5 | 5 | 5 |
| 15 | 5 | 5 | 5 | 5 |
| 16 | 10 | 10 | 10 | 10 |
| 17 | 15–16 | 14 | 12 | 10 |
| 18 | 16 | 14 | 12 | 10 |
| 20 | 16 | 14 | 13 | 12 |
| 21 | 16 | 16 | 16 | 16 |
| 22 | 16 | 16 | 16 | 16 |
| 23 | 15–16 | 15–16 | 15–16 | 15–16 |
| 24 | 14 | 15 | 14 | 14 |
| 25 | 16 | 15 | 15 | 14 |
| 26 | 15 | 15 | 14 | 14 |
| 27 | 16 | 14 | 12 | 12 |
| 28 | 14 | 13 | 12 | 11 |
| 29 | 14 | 13 | 12 | 11 |

As understood from the above Table, the degree of the sensitivity reduction caused by heating is small in the embodiments of the invention (Sample Nos. 1 to 8 and 20 to 29), and the thermal stability of the photopolymerization initiation system comprising the 2-polycyclic aryl-4,5-diphenylimidazolyl dimer having a halogen substituent at the ortho-position of the polycyclic aryl group (Sample Nos. 1 to 8 and 21 to 24) is especially excellent. The photopolymerization initiation system comprising the heterocyclic organic mercaptan compound (Sample Nos. 17 and 18) is highly sensitive but poor in thermal stability.

EXAMPLE 4

Onto a biaxially stretched film of polyethylene terephthalate of 100 microns in thickness having a lined layer, the following composition was applied by the aid of a reverse coater to make a photosensitive layer of 4 microns in thickness. The optical density of the photosensitive layer was 2.6 in average within a range of 350 to 400 m.

| | |
|---|---|
| Methyl methacrylate/methacrylic acid (7/3 by mol) copolymer | 43.4 parts |
| Carbon black (Ultraviolet rays absorber) | 10.6 parts |
| Trimethylolpropane triacrylate | 36.0 parts |
| Photopolymerization initiator (as shown in Table 4) | 10.0 parts |
| Hydroquinone monomethyl ether | 0.03 part |
| Methanol | 250.0 parts |
| Methylene chloride | 67.0 parts |

Onto the photosensitive layer, a 10% aqueous solution of polyvinyl alcohol (saponification degree, 98–99 mol %; degree of polymerization, 500) was applied to make a protective layer of 2 microns in thickness.

Onto the thus obtained film, a 21√2 step tablet was placed, and a ultra high pressure mercury lamp (a polymer printer 3000 manufactured by Oak Seisakusho; 140 W/m²) was irradiated thereto. The protective layer was washed out, and the resulting film was immersed in a 2% aqueous solution of sodium carbonate at 25° C. for 6 seconds. Development was carried out by rubbing with a sponge in water. The optimum exposure time (the exposure time required for curing 6 step in the step tablet) was determined.

For judgement of the thermal stability, the sample pieces were stored in an incubator maintained at 40° C. for one, two or three months, and the immersing time necessary for removing the unexposed photosensitive layer completely in a 2% aqueous solution of sodium carbonate at 25° C. and the optimum exposure time were determined. The results are shown in Table 4.

TABLE 4

| Sample No. | Photopolymerization initiation system | Molar ratio | Optimum exposure time (sec.) | | | | Alkali immersion (sec.) | | | |
|---|---|---|---|---|---|---|---|---|---|---|
| | | | Not in-cubated | After 1 month | After 2 months | After 3 months | Non in-cubated | After 1 month | After 2 months | After 3 months |
| 1 | 2-(2-Chloro-1-naphthyl)-4,5-diphenylimidazolyl dimer/Dimedone | 1/1 | 7 | 7 | 7 | 7 | 6 | 7 | 7 | 7 |
| 3 | 2-(2-Chloro-1-naphthyl)-4,5-diphenylimidazolyl dimer/N—(1-Naphthyl)-glycine | 1/1 | 8 | 8 | 8 | 8 | 6 | 7 | 7 | 7 |
| 9 | 2-(o-Chlorophenyl)-4,5-diphenylimidazolyl dimer/Dimedone | 1/1 | 55 | 55 | 55 | 55 | 6 | 7 | 7 | 7 |
| 11 | 2-(o-Chlorophenyl)-4,5-diphenylimidazolyl dimer/N—(1-Naphthyl)glycine | 1/1 | 65 | 65 | 65 | 65 | 6 | 7 | 7 | 7 |
| 17 | 2-(2-Chloro-1-naphthyl)-4,5-diphenylimidazolyl dimer/2-Mercaptobenzoxazole | 1/1 | 7 | 14 | 28 | 35 | 6 | 7 | 7 | 7 |
| 30 | Benzophenone/Michler's ketone | 5/1 | 60 | 60 | 70 | 80 | 6 | 7 | 6 | 7 |
| 31 | Benzoin ethyl ether | — | 240 | 500 | 1000 | — | 6 | 6 | 6 | 7 |
| 32 | Benzyl dimethyl ketal | — | 90 | 120 | 210 | 210 | 6 | 6 | 7 | 7 |

As understood from the above Table, the combination of 2-(2-chloro-1-naphthyl)-4,5-diphenylimidazolyl dimer as the 2-polycyclic aryl-4,5-diphenylimidazolyl dimer and the radical producing agent to be used in this invention requires only an extremely short time for exposure due to its high initiation potency. Such combination is particularly useful for a non-silver salt litho film having a photosensitive layer containing a high concentration of a ultraviolet rays absorbing agent which requires a photopolymerization initiation system of high sensitivity. Since it is excellent in thermal stability, the performances are hardly deteriorated even after stored for a long duration.

The litho film prepared by the use of the photopolymerization initiation system of the invention has no pinhole at the solid part and shows a good dot reproduction (150 1/inch, 5–95%). The reduction up to 15% was possible.

What is claimed is:

1. A photosensitive resin composition which comprises (1) an ethylenically unsaturated compound which can be addition polymerized to form a high molecular compound, said addition polymerization being initiated by a free radical and of chain-propagation, (2) a 2-naphthyl-4,5-diphenylimidazolyl dimer and (3) at least one compound selected from the group consisting of dimedone, indolacetic acid, N-naphthylglycine, S-lower alkylthioglycollic acid, 4,4'-bis[di(lower)alkylamino]benzyl, p-di(lower)alkylaminobenzoic ester, leucocrystalviolet, indoxylic acid, rhodanine, 7-di(lower)alkylaminocumarine and diarylthiourea, the molar ratio of the component (2) and the component (3) being from 2:1 to 1:5.

2. The composition according to claim 1, wherein the 2-naphthyl-4,5-diphenylimidazolyl dimer is the one substituted with a halogen atom at least at the orthoposition of the naphthyl group.

3. The composition according to claim 1, which further comprises a binding agent.

4. The composition according to claim 2 wherein the halogen atom is chlorine.

5. A composition according to claim 4, wherein the at least one compound (3) is selected from the group consisting of dimedone, indolacetic acid, N-naphthylglycine, S-lower alkylthioglycollic acid, 4,4'-bis-[di(lower)alkylamino]benzyl, p-di(lower)alkylaminobenzoic ester, leucocrystalviolet and indoxylic acid.

6. A composition according to claim 5, wherein the dimer is 2-(2-chloro-1-naphthyl)-4,5-diphenylimidazolyl dimer.

7. A composition according to claim 5, wherein the compound (3) comprises dimedone.

8. A composition according to claim 7, wherein the dimer is 2-(2-chloro-1-naphthyl-4,5-diphenylimidazolyl dimer.

* * * * *